United States Patent
Chen

(10) Patent No.: US 12,044,713 B2
(45) Date of Patent: Jul. 23, 2024

(54) SWITCH CONTROL UNIT AND OPTICAL CONTROL UNIT

(71) Applicant: Grace Connection Microelectronics Limited, Zhubei (TW)

(72) Inventor: Pei Wei Chen, Zhubei (TW)

(73) Assignee: Grace Connection Microelectronics Limited, Zhubei (TW)

( * ) Notice: Subject to any disclaimer, the term of this patent is extended or adjusted under 35 U.S.C. 154(b) by 212 days.

(21) Appl. No.: 17/857,046

(22) Filed: Jul. 4, 2022

(65) Prior Publication Data
US 2023/0023194 A1 Jan. 26, 2023

(30) Foreign Application Priority Data
Jul. 23, 2021 (TW) .................................. 110127083

(51) Int. Cl.
*G01R 19/25* (2006.01)
*G01R 19/165* (2006.01)
*G02B 6/42* (2006.01)
*H04Q 11/00* (2006.01)

(52) U.S. Cl.
CPC ... *G01R 19/2506* (2013.01); *G01R 19/16576* (2013.01); *G02B 6/4286* (2013.01); *H04Q 11/0005* (2013.01)

(58) Field of Classification Search
CPC .. G01R 19/25; G01R 19/2506; G01R 19/165; G01R 19/16576; G02B 6/42; G02B 6/4286; H04Q 11/00; H04Q 11/0005
See application file for complete search history.

(56) References Cited

U.S. PATENT DOCUMENTS

2006/0219870 A1* 10/2006 Kai .................... H04Q 11/0005
                                                    250/214 R
2011/0248194 A1* 10/2011 Svajda .................... G01S 17/46
                                                    250/552

* cited by examiner

*Primary Examiner* — Son T Le
(74) *Attorney, Agent, or Firm* — Anna Tsang

(57) ABSTRACT

A switch control unit and optical control unit, including: a digital-to-analog converter, being switchable between being coupled to a first sensing unit and being coupled to a drive unit, through a common contact pad; a sensing contact pad, coupled to a second sensing unit; an analog-to-digital converter, for sensing voltages at the contact pads when coupled to the sensing units, wherein each of the sensing units has a minimum working voltage level; and a loop switching unit, coupled between the common contact pad, the analog-to-digital converter, and the sensing contact pad, wherein when the voltage at the common contact pad is substantially higher than the minimum working voltage level, the loop switching unit conducts the common contact pad to the analog-to-digital converter to sense the voltage at the common contact pad, and the digital-to-analog converter enters a high-impedance state such that the digital-to-analog converter does not sense the voltage at the common contact pad.

12 Claims, 9 Drawing Sheets

SWITCH CONTROL UNIT AND OPTICAL CONTROL UNIT

CROSS REFERENCE

THE PRESENT INVENTION CLAIMS PRIORITY TO TW110127083, FILED ON Jul. 23, 2021.

BACKGROUND OF THE INVENTION

Field of Invention

The present invention provides a switch control unit and optical control unit thereof, especially a switch control unit and optical control unit thereof with a common contact pad shared and switchable between being coupled to a sensing unit and being coupled to a drive unit, for flexibly adjusting contact pad numbers between sensing and driving purposes in the same chip, wherein a frequency sensing capability of the switch control unit also increases.

Description of Related Art

Referring to FIG. 1, in the conventional optical fiber control system 10, analog-to-digital converters (ADC) 12 are configured to sense the voltage, and digital-to-analog converters (DAC) 14 are configured to control drive units for optical signal generation. Generally speaking, the total pin number of optical fiber control system is fixed, which is usually equal to the pin number of the digital-to-analog converters plus the pin number of the analog-to-digital converters. Based on various requirements, the analog-to-digital converters 12 and the digital-to-analog converters 14 often need more pin numbers than usual for possible pin demands (e.g., a combination of pins ADC_IN01 to ADC_IN32 for ADC, DAC_01 to DAC_16 for DAC). Or, it may be necessary to expand, adjust, change, increase or decrease the pin numbers of the analog-to-digital converter 12 and the digital-to-analog converter 14 to fulfill the requirements of sensing light intensity and controlling the signal generation in an optical fiber system. However, these pin number requirements are so far unable to be highly satisfied. The flexible arrangement between the sensing and actuation pins become more and more important. Further, a planar area of a general optical fiber control chip is usually limited, so that the number of pins in this chip is correspondingly limited. Therein, the required numbers of pins respectively coupled to the analog-to-digital converters 12 and the digital-to-analog converters 14, are independent and often diverse based on different pin function requirements. It is difficult and more and more important to develop a technology of flexible pin combinations arrangement in the same chip.

In addition, when a photoelectric diode 16 is used in the sensing circuit to sense light intensity, a voltage leveling capacitor (voltage regulating capacitor) C is often required to reduce noise. The sensing circuit usually has an operating voltage range based on voltage sensing purpose. The operating voltage range is usually a voltage range substantially higher a minimum working voltage level (e.g., a voltage level according to voltage leveling capacitor C and charging characteristics of a resistor coupled between the photoelectric diode 16 and ground) for voltage sensing purpose. During sensing a voltage, there is a delay for raising a voltage across the voltage leveling capacitor C to be substantially above the minimum working voltage level, which causes to wait for a startup time before each sensing operation. Based on requirements of higher and higher switching frequency of the optical fiber signals in the market, the startup time needs to get shorter and shorter, wherein the switching frequency is highly related to the frequency sensing capability of the optical fiber signals. This startup time is a key for increasing the switching frequency and the optical fiber signal communication speed.

According to the present invention, the technology of flexibly pin function arrangement and increasing frequency sensing capability, is one of the important keys in optical fiber signal technologies.

SUMMARY OF THE INVENTION

To the technical problems above-mentioned, the objects of the present invention are to provide high frequency sensing and flexibly arranging contact pads between control and sensing purposes in the same chip. The present invention provides a switch control unit (for example, the switch control unit in an optical fiber control system), which includes: a digital-to-analog converter (DAC), being switchable between being coupled to a first sensing unit and being coupled to a drive unit, through a common contact pad; a sensing contact pad, coupled to a second sensing unit; an analog-to-digital converter (ADC), for sensing a voltage at the contact pad (the common contact pad or the sensing contact pad) coupled to the sensing unit to determine light intensity (transmitted in the optical fiber control system), wherein each of the first and second sensing units has a minimum working voltage level; and a loop switching unit, coupled between the common contact pad, the analog-to-digital converter, and the sensing contact pad. When the voltage at the common contact pad is substantially higher than the minimum working voltage level, the loop switching unit conducts the common contact pad to the analog-to-digital converter to sense the voltage at the common contact pad, and the digital-to-analog converter enters a high-impedance state such that the digital-to-analog converter does not sense the voltage at the common contact pad. The minimum working voltage level can be a minimum voltage for activating the sensing units to work on sensing. In a point of view, "a voltage substantially higher than the minimum working voltage level" usually means a voltage higher than the minimum working voltage level, or a voltage close to the minimum working voltage level, which is high enough to activate the sensing units to work on sensing.

In one embodiment, when the voltage at the common contact pad coupled to the first sensing unit, is lower than the minimum working voltage level (unable to activate the sensing unit to sense), the digital-to-analog converter charges the voltage leveling capacitor to reduce a delay time for the voltage leveling capacitor to reach the minimum working voltage level.

In one embodiment, each of the first and second sensing units has a voltage leveling capacitor.

In one embodiment, the sensing of the voltage at the contact pad coupled to the sensing unit, can be used to determine the light intensity, or a voltage sensing based on other purposes, wherein the user can determine its application measures according to need.

In one embodiment, when the voltage at the common contact pad coupled to the first sensing unit is lower than the minimum working voltage level, the loop switching unit can conduct the digital-to-analog converter through the common contact pad to the voltage leveling capacitor, to quickly charge the voltage leveling capacitor. It can accelerate a voltage rise in the voltage leveling capacitor, to shorten a required time for the voltage leveling capacitor to reach the minimum working voltage level. Therefore, by charging the voltage leveling capacitor, the startup time required for each light sensing operation can be shortened, such that the sensible light frequency can be greatly increased.

In one embodiment, the loop switching unit includes: a multiplexer, which has a plurality of input terminals coupled to a plurality of contact pads, and an output terminal coupled to the analog-to-digital converter. By switching the connection to the input terminals of the multiplexer, the different contact pads can be coupled to the analog-to-digital converter for voltage sensing, where the contact pads can include the common contact pad and the sensing contact pads.

In addition to the aforementioned switching operation corresponding to the common contact pad, the loop switching unit can also perform a switching operation corresponding to the sensing contact pads (e.g., switching for charging the voltage leveling capacitor in the second sensing unit).

In the aforementioned embodiment, when the common contact pad is coupled to the first sensing unit, the digital-to-analog converter can rapidly charge the voltage leveling capacitor in the first sensing unit. If necessary, the loop switching unit can also be coupled between the digital-to-analog converter and the sensing contact pad, for charging the voltage leveling capacitor in the second sensing unit, to shorten the time required to activate the light sensing and improve the sensible light frequency capability. The charging operation in the second sensing unit is similar to the charging operation of the voltage leveling capacitor in the first sensing unit coupled to the common contact pad. The coupling and charging operations corresponding to the second sensing unit includes conducting the digital-to-analog converter to the sensing contact pad through the loop switching unit. The difference from the previous embodiment is: when the analog-to-digital converter senses the voltage at the second sensing unit coupled to the sensing contact pad, the sensing contact pad is not coupled to the digital-to-analog converter, and the power-down signal is not required for changing an impedance state of the digital-to-analog converter.

If necessary, the aforementioned first and second sensing units, can be included in the switch control unit, or externally coupled to the switch control unit. The first and second sensing units can have the same circuit design or different circuit designs, which depends on the practical need.

In one embodiment, the loop switching unit needs to switch for coupling the digital-to-analog converter to the sensing contact pad, and the loop switching unit includes: a multiplexer and a switch. The multiplexer is used to switch different contact pads to be coupled to the analog-to-digital converter, and the switch is coupled between the common contact pad and the sensing contact pad (or, between the digital-to-analog converter and the sensing contact pad).

In one perspective, the present invention provides an optical control unit, including: a digital-to-analog converter, being switchable between being coupled to a first sensing unit and being coupled to a drive unit, through a common contact pad; a sensing contact pad, coupled to a second sensing unit; an analog-to-digital converter, for sensing voltages at the contact pads coupled to the sensing units, to determine light intensity, each of the sensing units has a photoelectric diode, a voltage leveling capacitor, and a minimum working voltage level; and a loop switching unit, coupled between the common contact pad, the analog-to-digital converter, and the sensing contact pad, wherein when a voltage at the common contact pad is substantially higher than the minimum working voltage level, the loop switching unit conducts the common contact pad to the analog-to-digital converter to sense the voltage at the common contact pad.

In one embodiment, when the voltage at the common contact pad coupled to the first sensing unit is lower than the minimum working voltage level, the digital-to-analog converter charges the voltage leveling capacitor in the first sensing unit.

In one embodiment, the first sensing unit or the drive unit coupled to the common contact pad, can be the first sensing unit and the drive unit disposed in a light-emitting device.

In one perspective, the present invention provides an optical control unit, which includes: at least one digital-to-analog converter, coupled to at least one common contact pad, each of the digital-to-analog converters being switchable between being coupled to a first sensing unit and being coupled to a drive unit, via the common contact pad; at least one sensing contact pad, coupled to at least one second sensing unit; an analog-to-digital converter, for sensing a voltage at the common or sensing contact pad to determine the light intensity, each of the sensing units has a photoelectric diode, a voltage leveling capacitor, and a minimum working voltage level; and a loop switching unit, coupled between the common contact pad, the analog-to-digital converter, and the sensing contact pad. When the voltage at the common contact pad is substantially higher than the minimum working voltage level, the loop switching unit conducts the common contact pad to the analog-to-digital converter to sense the voltage at the common contact pad.

In one perspective, the present invention provides a switch control unit, which includes: a common contact pad, which is switchable between being coupled to a sensing unit and being coupled to a drive unit; a digital-to-analog converter and an analog-to-digital converter, separately coupled to the common contact pad; wherein, when the voltage at the common contact pad is substantially higher than the minimum working voltage level, the analog-to-digital converter senses the voltage at the common contact pad.

In one perspective, the present invention provides a switch control unit, which includes: a common contact pad, being switchable between being coupled to a sensing unit and being coupled to a drive unit, wherein the sensing unit has a voltage leveling capacitor; a digital-to-analog converter and an analog-to-digital converter, separately coupled to the common contact pad; wherein, when the voltage at the common contact pad is substantially higher than the minimum working voltage level, the analog-to-digital converter senses the voltage at the common contact pad.

In one perspective, the present invention provides an optical control unit, which includes: a common contact pad, which is switchable between being coupled to a sensing unit and being coupled to a drive unit; a digital-to-analog converter and an analog-to-digital converter, separately coupled to the common contact pad; wherein, when the voltage at the common contact pad is substantially higher than the minimum working voltage level, the analog-to-digital converter senses the voltage at the common contact pad. The sensing unit and the drive unit are used for the operation of optical sensing and optical signal generation.

In one perspective, the present invention provides an optical control unit of an optical fiber control system, which includes: a common contact pad, which is switchable between being coupled to a sensing unit and being coupled to a drive unit, wherein the sensing unit includes a voltage leveling capacitor; a digital-to-analog converter and a drive unit, separately coupled to the common contact pad;

wherein, when a voltage at the common contact pad is substantially higher than the minimum working voltage level, the analog-to-digital converter senses the voltage at the common contact pad.

In one embodiment, the optical control unit has a total pin number, the common contact pad can be used to flexibly adjust, change, increase or expand the pin number of the digital-to-analog converters, the pin number of the analog-to-digital converters in a switchable way, wherein the total pin number is equal to the pin number of the digital-to-analog converters plus the pin number of the analog-to-digital converters.

For better understanding the above and other aspects of the present invention, the detailed description of the embodiments and the accompanying drawings are provided as follows.

DESCRIPTION OF THE PREFERRED EMBODIMENTS

The objectives, technical details, features, and effects of the present invention will be better understood with regard to the further detailed description of the embodiments below, with reference to the drawings. Obviously, the described embodiments are only a part of the present invention, rather than all.

Figure 1:
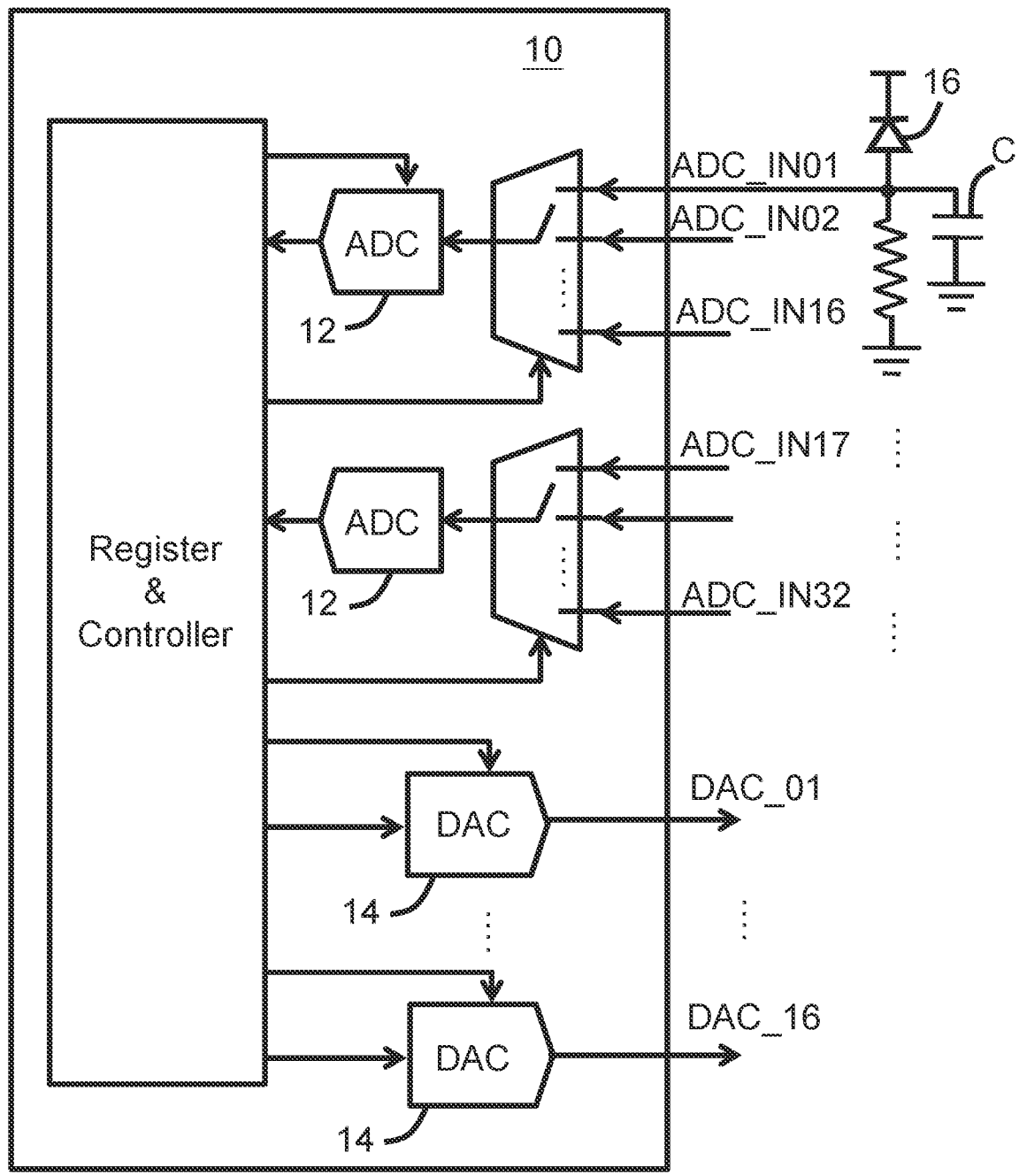
FIG. 1 shows a schematic diagram of a switch control unit according to the prior art.
Figure 2A:
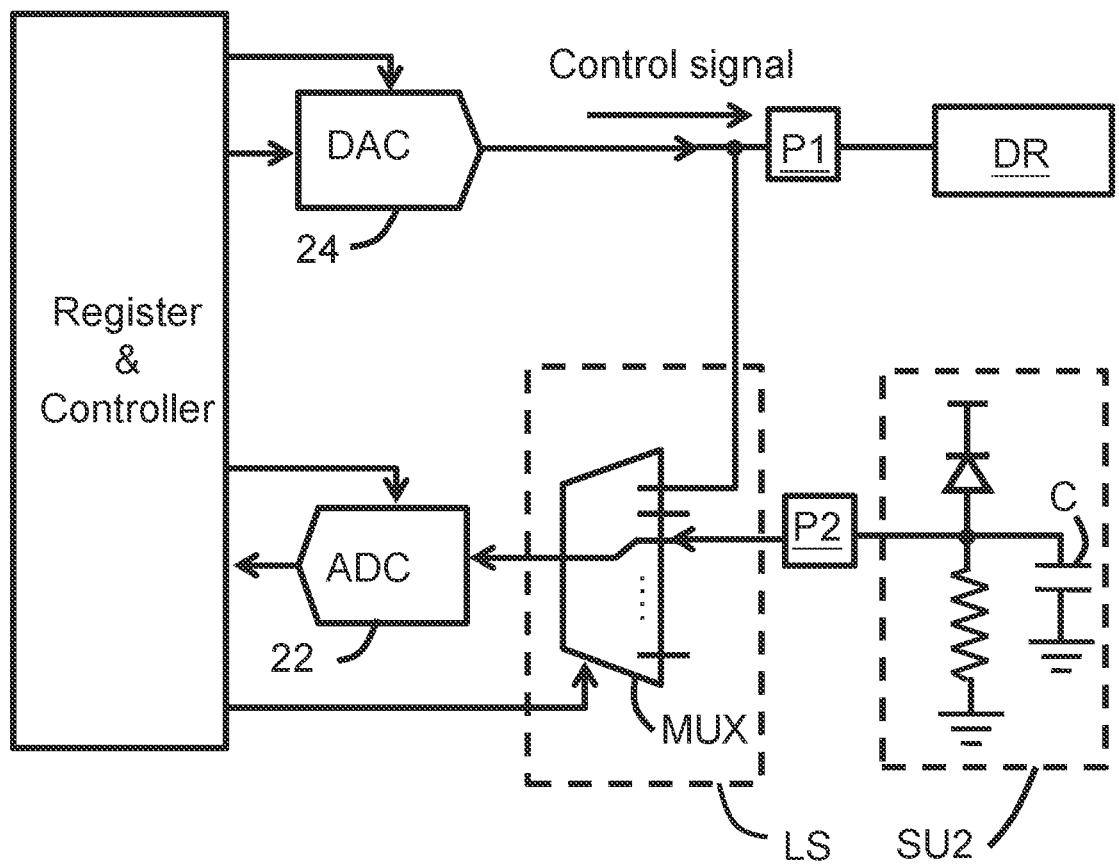
FIGS. 2A, 2B, and 2C show schematic diagrams of a switch control unit of an optical fiber control system according to one embodiment of the present invention.
Figure 2B:
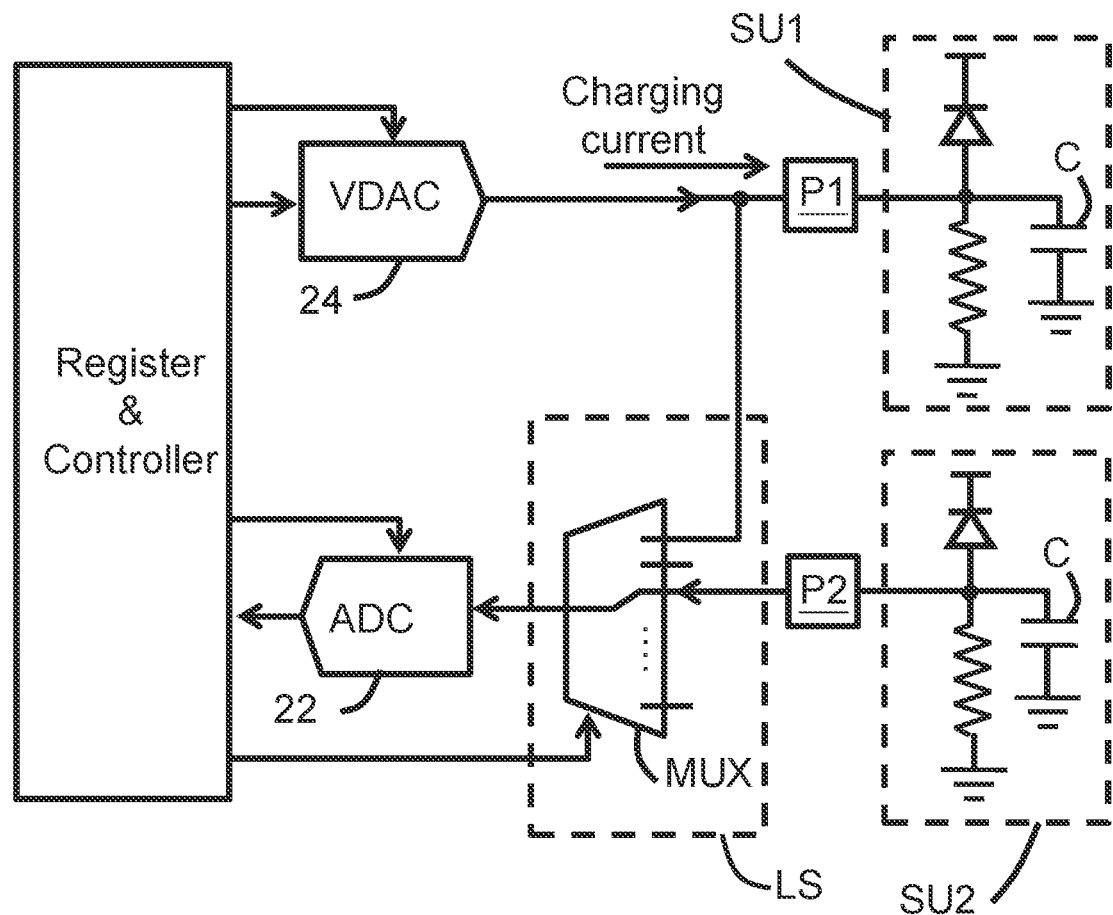
Figure 2C:
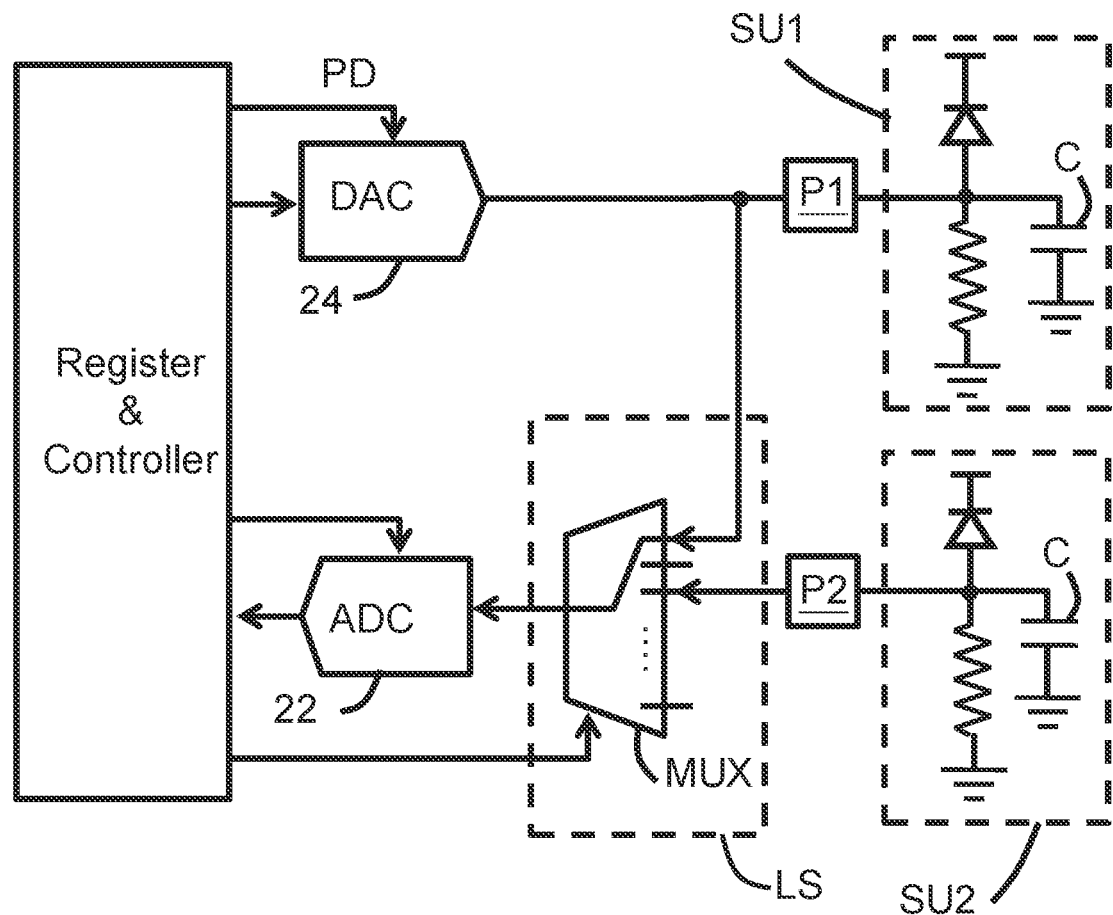

As shown in FIGS. 2A, 2B, and 2C, in one perspective, the present invention provides two operation modes of a switch control unit in an optical fiber control system. FIG. 2A shows that a common contact pad P1 is coupled to a drive unit DR. FIGS. 2B and 2C show that the common contact pad P1 is coupled to a first sensing unit SU1. FIG. 2B shows that the first sensing unit SU1 is under charging, and FIG. 2C shows that the first sensing unit SU1 is under voltage sensing. The switch control unit includes: a digital-to-analog converter (DAC) 24, which is switchable between being coupled to a first sensing unit SU1 (FIGS. 2B and 2C) and being coupled to a drive unit DR (FIG. 2A) via a common contact pad P1; a sensing contact pad P2, coupled to a second sensing unit SU2; an analog-to-digital converter (ADC) 22, for sensing a voltage at the common contact pad P1 or the sensing contact pad P2 when they coupled to the sensing unit (for example, sensing the sensing contact pad P2 coupled to the second sensing unit SU2 in FIG. 2A, and sensing the common contact pad P1 coupled to the first sensing unit SU1 in FIG. 2C), to determine light intensity or other corresponding voltage related sensing results, wherein each of the first and second sensing units SU1 and SU2 has a minimum working voltage level; and a loop switching unit LS, coupled between the common contact pad P1, the analog-to-digital converter 22, and the sensing contact pad P2, wherein when the voltage at the common contact pad P1 is substantially higher than the minimum working voltage level, the loop switching unit LS conducts the common contact pad P1 to the analog-to-digital converter 22 (FIG. 2C), to sense the voltage at the common contact pad P1.

As shown in FIG. 2A, the common contact pad P1 is configured to electrically connect the digital-to-analog converter (DAC) 24 with the drive unit DR. At this time, the common contact pad P1 does not electrically connect the analog-to-digital converter (ADC) 22. As shown in FIGS. 2B and 2C, the common contact pad P1 is configured to electrically connect the analog-to-digital converter (ADC) 22 with the first sensing unit SU1. At this time, the common contact pad P1 is used for charging the first sensing unit SU1 or sensing the voltage at the first sensing unit SU1, and the common contact pad P1 does not electrically connect the digital-to-analog converter (DAC) 24. Thus, the common contact pad P1 can be shared and switchable between being coupled to the drive unit DR and being coupled to the sensing unit SU1, so that the contact pad numbers can be flexibly adjusted in a same chip.

In one embodiment, each of the first and second sensing units SU1 and SU2 has a voltage leveling capacitor (voltage regulating capacitor) C. When the voltage at the common contact pad P1 coupled to the first sensing unit SU1 is lower than the minimum working voltage level, the digital-to-analog converter 24 charges the voltage leveling capacitor C (FIG. 2B) to shorten a delay time for the voltage leveling capacitor C to reach the minimum working voltage level.

In the aforementioned embodiment, the first and second sensing units SU1 and SU2 can include the same circuits and elements, or include different circuits and elements as required.

In comparison with the prior art, in the embodiments of FIGS. 2A, 2B, and 2C, the common contact pad P1 is shared to control the drive unit DR or to be coupled to the first sensing unit SU1 for generating a sensing result, which provides coupling flexibility on the same contact pad. In the present invention, it is not necessary to include or replace other circuits (or chip) for versatile functional requirements of contact pads, to resolve the problem of short of few specific functional contact pads. In the present invention, it is very convenient to rearrange the contact pads based on different functions in the same chip, especially flexibly switching between coupling to the analog-to-digital converter 22 and coupling to the digital-to-analog converter 24, to save a lot of costs and manpower for replacement of different contact pads. The user only needs to switch connection between the common contact pad P1 and the drive unit DR, or connection between the common contact pad P1 and the first sensing unit SU1 according to the requirements, to achieve more flexibility in contact pad rearrangement over the prior art.

In one embodiment, the sensed voltages at the contact pad P1 and P2, respectively coupled to the sensing units SU1 and SU2, can be used to determine the light intensity or other voltage related sensing properties, wherein the user can determine its application as required.

The common contact pad P1 is switchable between being coupled to the first sensing unit SU1 and being coupled to the drive unit DR. When voltage sensing is performed, the common contact pad P1 is coupled to the first sensing unit SU1 and not conducted to the drive unit DR (FIG. 2C); or, when connecting the drive unit DR, the common contact pad P1 is coupled to the drive unit DR (FIG. 2A), and not coupled to the first sensing unit SU1. According to the present invention, the digital-to-analog converter 24 is switchable between being coupled to the first sensing unit SU1 and being coupled to the drive unit DR, by sharing the common contact pad P1 according to different purposes. The switching can be performed by means of circuits, firmware, software or the like. Therein, the common contact pad P1 can be flexibly switched into the coupling to different external circuits (e.g., the first sensing unit SU1, the drive unit DR), such that the number of the contact pads do not need to be increased corresponding to different function requirements.

The voltage leveling capacitors C respectively in the first and second sensing units SU1 and SU2, are disposed for filtering noise, and their capacitance values depend on the design of the sensing units SU1 and SU2. In one embodiment, each of the sensing units SU1 and SU2 includes a photoelectric diode and the voltage leveling capacitor C (for example, the photoelectric diode is a PIN type diode used to sense the light intensity, and the PIN type diode can be used to sense the voltages of the contact pads P1 and P2 when the PIN type diode is reverse biased. Further, photoelectric diode cam be a photodetector decided by embodying purpose; wherein the capacitance values of the voltage leveling capacitors C are usually much higher than an equivalent capacitance in the PIN-type diode (for example, several times, ten times, or more than a hundred times over the equivalent capacitance value). Each of the sensing units SU1 and SU2 has a working voltage range, and the working voltage range has a minimum working voltage level. The charging of the voltage leveling capacitor C of the present invention can shorten the time required for the contact pad P1 and P2 to reach the minimum working voltage levels. As one knows, the analog-to-digital converter 22 can start to sense the light intensity only after the voltage leveling capacitor C is charged to the minimum working voltage level. The charging process of the present invention can reduce a delay time to quickly start to sense the light intensity, so that it largely improves the sensible light frequency and efficiency.

In one embodiment, a photoelectric diode (also called photodiodes or photodetector) of the sensing units SU1 or SU2 is an essential component in an optical fiber control system. The main function of the photoelectric diode is to detect an output of a laser diode. Testing laser diodes for fiber optic control system requires photodiodes with fast response times. The photodiodes with short rise times are important requirements and consideration features.

Importantly, in the aforementioned voltage sensing embodiments, the sensing components in the first and second sensing units SU1 and SU2 are used to generate different voltage values corresponding to different light intensity sensing results, wherein the sensing components can be not limited to the aforementioned photodiodes. Other components that can generate different voltage values or current values corresponding to different light intensity sensing results (e.g., current through a series resistor for reading the voltage across the resistor), such as thermistors, can also be applied by the technology proposed in the present invention. Thus, the present invention can reduce the number of contact pads required and increase the sensing frequency.

In one embodiment, the components included in the sensing unit can be determined according to a practical need. For example, when the sensing unit substantially uses the thermistor to sense temperature, the voltage leveling capacitor is not necessary because the thermistor has a longer response time. For another example, when the sensing unit needs to filter noise, it can include voltage leveling capacitor to filter noise. For yet another example, when the sensing unit is used to sense the light intensity, it can have a photoelectric diode and a voltage leveling capacitor to achieve reliable and stable sensing results.

Please refer to FIGS. 2B and 2C, wherein when the voltage of the first sensing unit SU1 coupled to the common contact pad P1 is lower than the minimum working voltage level (or, the voltage of the voltage leveling capacitor C is lower than the minimum working voltage level), the digital-to-analog converter 24 can fast and timely charge the voltage leveling capacitor C through the common contact pad P1. Thus, it can speed up the voltage boost speed of the voltage leveling capacitor C and shorten the time required for the voltage leveling capacitor C to reach the minimum working voltage level. Therefore, by charging the voltage leveling capacitor C with the digital-to-analog converter 24, the startup time required for light sensing can be greatly shortened, and the sensible light frequency can be greatly increased to a higher level.

When the voltage of the voltage leveling capacitor C reaches the minimum working voltage level, a power-down signal PD is transmitted to the digital-to-analog converter 24 (FIG. 2C) to control the digital-to-analog converter 24 to enter a high-impedance state, and thus the digital-to-analog converter 24 shut down and can not accept the voltage signal. At this moment, the loop switching unit LS conducts the common contact pad P1 to the analog-to-digital converter 22, so that the analog-to-digital converter 22 is coupled to the first sensing unit SU1 through the common contact pad P1, to sense the voltage at the common contact pad P1. For example, the analog-to-digital converter 22 senses the voltage at the common contact pad P1 coupled to the first sensing unit SU1, to determine the light sensing result based on the sensed voltage value. In this way, by the loop switching unit LS and the power-down signal PD to switch the common contact pad P1 between being coupled to the digital-to-analog converter 24 and being coupled the analog-to-digital converter 22, the benefits of shortening the startup time required for light sensing and flexible coupling rearrangement of the common contact pad P1 can be achieved.

In one embodiment, as shown in FIGS. 2A and 2B, the loop switching unit LS includes: a multiplexer MUX, including a plurality of input terminals coupled to a plurality of contact pads (for example: the common contact pad P1 and the sensing contact pad P2), and an output terminal coupled to the analog-to-digital converter 22. With the connection switch operation between the input terminals of the multiplexer MUX, the loop switching unit LS can be flexibly coupled between the analog-to-digital converter 22 and the different contact pads (for example: the common contact pad P1 and the sensing contact pad P2) for sensing voltages at multiple contact pads.

In the present invention, the aforementioned coupling and switching operation for the common contact pad P1 during sensing operation, can be flexibly adjusted according to the different numbers of the contact pads required for light-emitting sensing. For example, when the number of the contact pads required for light-emitting sensing increases, more of the common contact pads P1 can be switched into the coupling to the corresponding first sensing units SU1. For another example, when the number of the contact pads required for light-emitting sensing purpose decreases, the number of common contact pads P1 coupled to the first sensing unit s SU1 can be reduced. Or, all the common contact pads P1 are switched into the coupling to the corresponding drive units DR, but not coupled to the first sensing units SU1. In this way, under different required numbers of the contact pads between different functions, there is no need to extra add the numbers of the predetermined contact pads formed on the same wafer, so that the present invention can provide high flexibility to rearrange the contact pad numbers according to different functions.

Figure 3A:
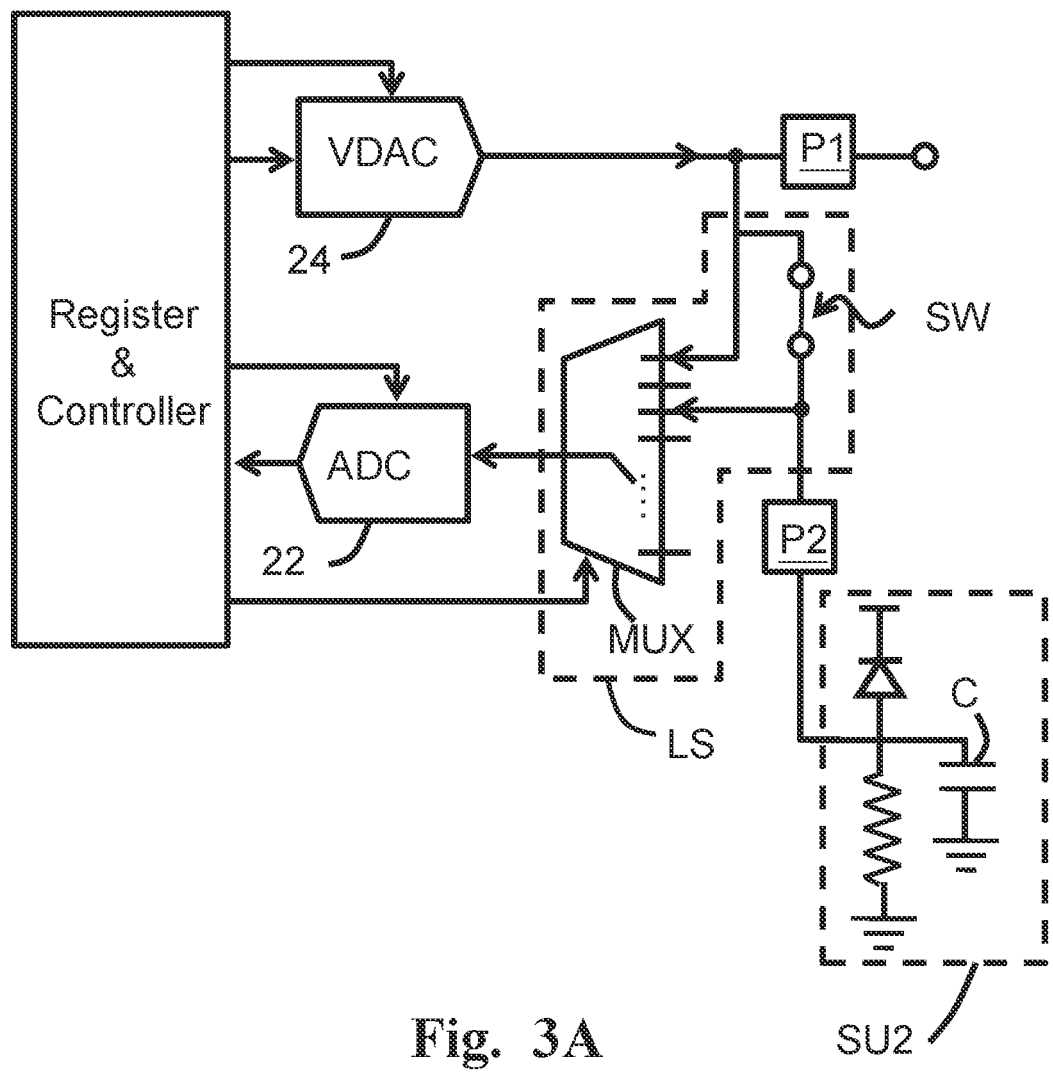
FIGS. 3A and 3B show schematic diagrams of a switch control unit of an optical fiber control system according to another embodiment of the present invention.
Figure 3B:
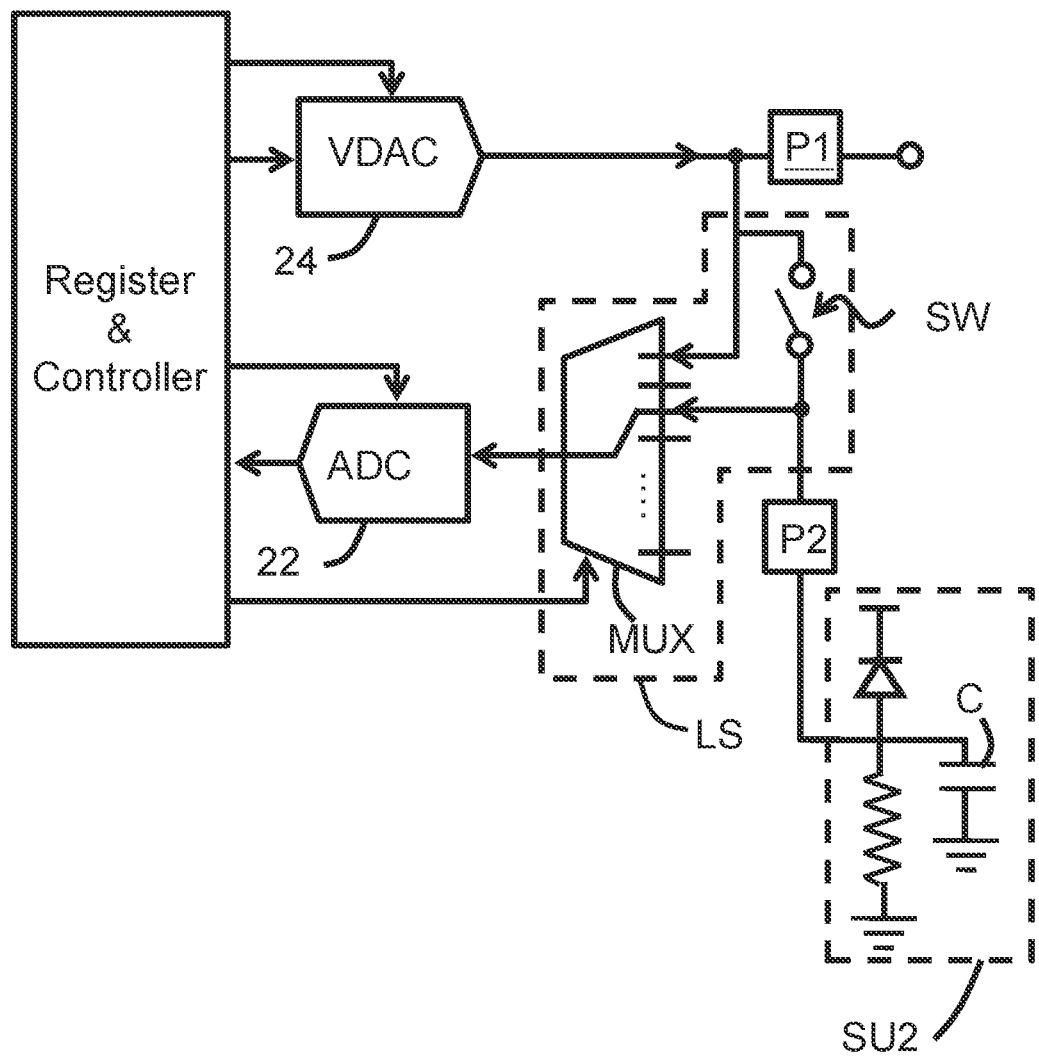

Besides the aforementioned switching operation for the common contact pad P1, the loop switching unit LS can be used to perform switching operation for the sensing contact pad P2. Please refer to one embodiment shown in FIG. 3A, wherein when the voltage at the sensing contact pad P2 is lower than the minimum working voltage level, the loop switching unit LS conducts the sensing contact pad P2 to the digital-to-analog converter 24, to charge the voltage leveling capacitor C in the second sensing unit SU2, for shortening the time required for sensing purpose. When the voltage of the sensing contact pad P2 is substantially higher than the minimum working voltage level, the loop switching unit LS conducts the sensing contact pad P2 to the analog-to-digital converter 22 (but does not conduct the common contact pad P1 to the digital-to-analog converter 24), to sense the voltage of the sensing contact pad P2. FIGS. 3A and 3B mainly illustrate the embodiment corresponding to the sensing contact pad P2, the circuit units coupled to the common contact pad P1 are not shown in detail. Please refer to the above-mentioned embodiment for the relevant detail.

In one embodiment, the digital-to-analog converter has a main function of converting digital code that represents digital value to analog current or voltage. There are many types of the digital-to-analog converter 24, for example, binary weighted resistor DAC, binary ladder or R-2R ladder DAC, segmented DAC, delta-sigma DAC, Voltage DAC (VDAC), and Current DAC (IDAC), etc. Voltage DAC outputs a voltage that varies with the DAC setting, wherein a voltage DAC might output between 0 and 3.3 Volts. Current DAC outputs a current that varies with the DAC setting, wherein a current DAC might output between 0 and 2 mA. The digital-to-analog converter 24 of the present invention is preferred a Voltage DAC (or called VDAC), as shown in FIGS. 3A and 3B.

In short, the coupling and charging operations of the second sensing unit SU2, are based on conducting the digital-to-analog converter 24 through the loop switching unit LS to the sensing contact pad P2. The difference from the aforementioned embodiment of the first sensing unit SU1 is: when the analog-to-digital converter 22 senses the voltage at the sensing contact pad P2 coupled to the second sensing unit SU2, the sensing contact pad P2 is not coupled to the digital-to-analog converter 24, and no power-down signal PD is required to change the impedance state of the digital-to-analog converter 24 in this operation.

Please refer to one embodiment shown in FIGS. 3A and 3B, wherein the loop switching unit LS can switch the digital-to-analog converter 24 to be coupled to the sensing contact pad P2. The loop switching unit LS includes: a multiplexer MUX and a switch SW. The multiplexer MUX used to switch between coupling the analog-to-digital converter 22 to the sensing contact pad P1 and coupling the analog-to-digital converter 22 to the sensing contact pad P2. The switch SW is coupled between the common contact pad P1 and the sensing contact pad P2. The switch SW can be a normally open switch. When the switch SW is turned on, the digital-to-analog converter 24 is switched to be coupled to the sensing contact pad P1, to charge the voltage leveling capacitor C in the second sensing unit SU2 through the sensing contact pad P2. When the voltage leveling capacitor C reaches the minimum working voltage level, the switch SW is turned off (the power-down signal PD not required to change the impedance state of the digital-to-analog converter 24), and the multiplexer MUX conducts the analog-to-digital converter 22 to the sensing contact pad P2 for voltage sensing.

According to one perspective as shown in FIGS. 2A, 2B, and 2C, the switch control unit can be applied to optical sensing. Thus, the present invention provides an optical control unit, including: a digital-to-analog converter 24, which is switchable between being coupled to the first sensing unit SU1 and being coupled to the drive unit DR in a light-emitting device (not shown, wherein the drive unit DR can control an optical signal generation by the light-emitting device) through a common contact pad P1; a sensing contact pad P2, coupled to a second sensing unit SU2; an analog-to-digital converter 22, used to sense the voltages at the contact pads P1 and P2 which are respectively coupled to the sensing units SU1 and SU2, to determine the light intensity, wherein each of the sensing units SU1 and SU2 has a minimum working voltage level, and each of the sensing units SU1 and SU2 has a photoelectric diode and a voltage leveling capacitor C; and a loop switching unit LS, coupled between the common contact pad P1, the analog-to-digital converter 22, and the sensing contact pad P2, wherein when the voltage at the common contact pad P1 is substantially higher than the minimum working voltage level, the loop switching unit LS conducts the common contact pad P1 to the analog-to-digital converter 22, to sense the voltage at the common contact pad P1.

In one embodiment, when the voltage at the common contact pad P1 coupled to the first sensing unit SU1 is lower than the minimum working voltage level, the digital-to-analog converter 24 optionally charges the voltage leveling capacitor C.

In one embodiment, wherein the numbers of the digital-to-analog converters 24, the common contact pads P1, and the first sensing units SU1 each are greater than one. The present invention provides an optical control unit, which includes: at least one digital-to-analog converter 24, coupled to at least one common contact pad P1, each of the digital-to-analog converter 24 being switchable between being coupled to the first sensing unit SU1 and being coupled to the drive unit DR, through the common contact pad P1; at least one sensing contact pad P2, coupled to at least one second sensing unit SU2; and an analog-to-digital converter 22, used for sensing the voltages at the contact pads P1 and P2, to determine the light intensity, wherein each of the sensing units SU1 and SU2 has a minimum working voltage level, a photoelectric diode and a voltage leveling capacitor C; and at least one loop switching unit LS, coupled between the at least one common contact pad P1, the analog-to-digital converter 22, and the at least one sensing contact pad P2. When the voltage at the common contact pad P1 coupled to the first sensing unit SU1 is lower than the minimum working voltage level, the digital-to-analog converter 24 charges the voltage leveling capacitor C in the first sensing unit SU1. When the voltage at the common contact pad P1 is substantially higher than the minimum working voltage level, the loop switching unit LS conducts the common contact pad P1 to the analog-to-digital converter 22 to sense the voltage at the common contact pad P1.

Figure 4A:
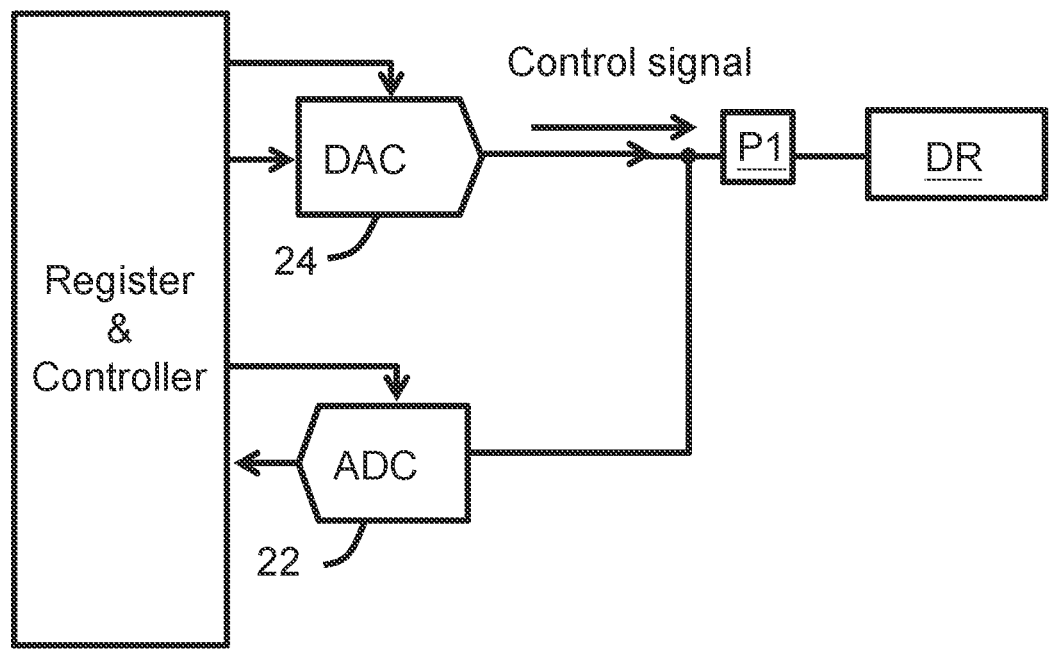
FIGS. 4A, 4B, and 4C show schematic diagrams of a switch control unit of an optical fiber control system according to another embodiment of the present invention.
Figure 4B:
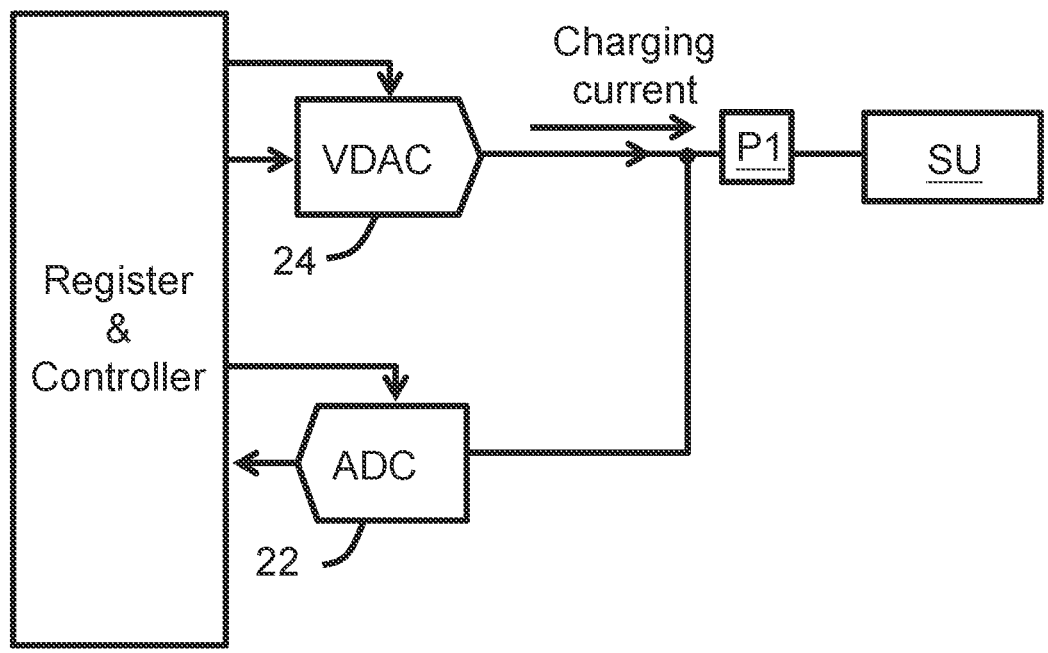
Figure 4C:
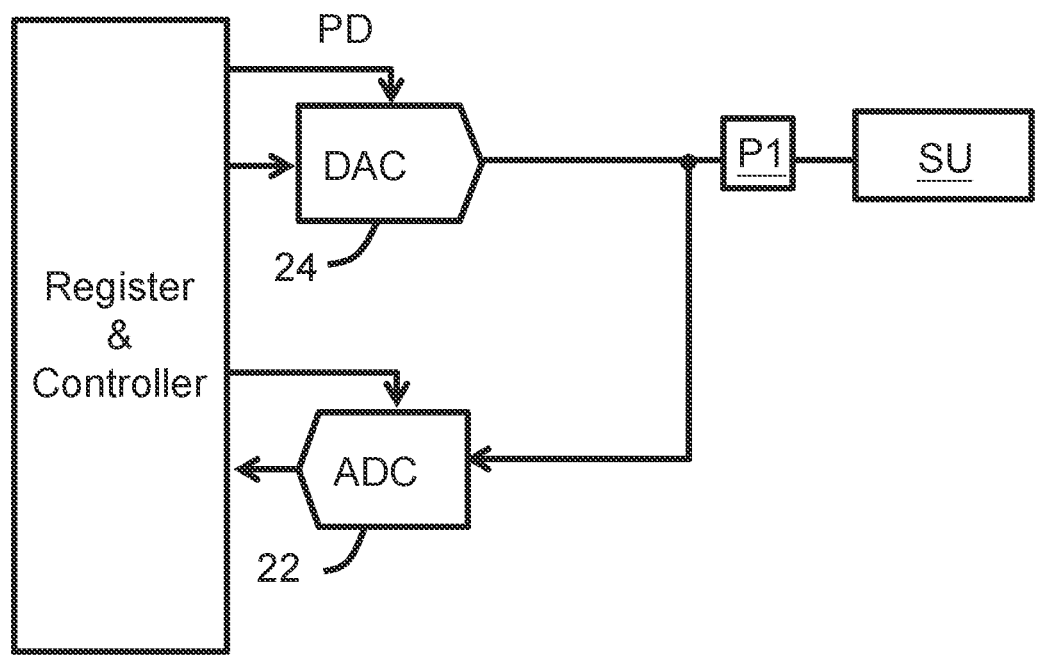

In one perspective, the present invention provides a switch control unit, which may not include the loop switching unit nor the multiplexer, to perform the coupling and switching operations for the contact pads. In FIGS. 4A, 4B, and 4C, the switch control unit includes a common contact pad P1, which is switchable between being coupled to a drive unit DR (FIG. 4A) and being coupled to a sensing unit SU (FIGS. 4B and 4C), wherein the sensing unit SU optionally has a voltage leveling capacitor C; and a digital-to-analog converter (including DAC or VDAC) 24 and an analog-to-digital converter 22, separately coupled to the common contact pad P1. When the voltage at the common contact pad P1 is substantially higher than the minimum working voltage level, the analog-to-digital converter 22 senses the voltage at the common contact pad P1 (FIG. 4C).

In one embodiment, when the voltage at the common contact pad P1 coupled to the sensing unit SU1 is lower than the minimum working voltage level, the digital-to-analog converter 24 optionally charges the voltage leveling capacitor in the sensing unit SU (FIG. 4B).

The switch control unit shown in FIGS. 4A, 4B, and 4C, include only a common contact pad P1, which is switchable between being coupled to a sensing unit SU and being coupled to a drive unit DR. However, the switch control unit in this embodiment, is not necessarily to dispose only one common contact pad therein, but a plurality of common contact pads to meet the increasing demands of various required numbers of the contact pads between different function requirements.

In one perspective, the switch control unit of FIGS. 4A, 4B, and 4C can also be applied to the optical control unit. Thus, optical control unit includes a common contact pad P1, which is switchable between being coupled to a drive unit DR (FIG. 4A) and being coupled to a sensing unit SU (FIGS. 4B, 4C), wherein the sensing unit SU optionally has a voltage leveling capacitor; and a digital-to-analog converter 24 and an analog-to-digital converter 22, separately coupled to the common contact pad P1; wherein, when the voltage at the common contact pad P1 is substantially higher than the minimum working voltage level, the analog-to-digital converter 22 senses the voltage at the common contact pad P1 (FIG. 4C).

In this point of view, the related descriptions of the components and operations of the optical control unit (the operation of the power-down signal PD, etc.), please refer to the descriptions of the foregoing embodiments, which is not necessarily to be repeated here.

The aforementioned contact pads can include: contact pads on the circuit, pads, pins of the chip, etc. The user can decide the embodied choices of the contact pads as needed.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the present invention can be applied to other voltage or current sensing unit besides optical sensing.

What is claimed is:

1. A switch control unit of an optical fiber control system, including:
   a common contact pad;
   a digital-to-analog converter, coupled to a first sensing unit or a drive unit, through the common contact pad;
   a sensing contact pad, coupled to a second sensing unit;
   an analog-to-digital converter, sensing a voltage at the common contact pad coupled to the first sensing unit or the second sensing unit, wherein the first sensing unit or the second sensing unit has a minimum working voltage level; and
   a loop switching unit, coupled between the common contact pad, the analog-to-digital converter, and the sensing contact pad,
   wherein when the voltage at the common contact pad is substantially higher than the minimum working voltage level, the loop switching unit conducts the common contact pad to the analog-to-digital converter to sense the voltage at the common contact pad, and the digital-to-analog converter enters a high-impedance state such that the digital-to-analog converter does not sense the voltage at the common contact pad.

2. The switch control unit of the optical fiber control system of claim 1, wherein when the voltage at the common contact pad coupled to at least one of the sensing units is lower than the minimum working voltage level, the digital-to-analog converter charges a voltage leveling capacitor in the sensing units.

3. The switch control unit of the optical fiber control system of claim 1, wherein each of the sensing units includes a voltage leveling capacitor coupled to the contact pad; or, each of the sensing units includes a photodiode coupled to the contact pad and the voltage leveling capacitor.

4. The switch control unit of the optical fiber control system of claim 3, wherein the voltage leveling capacitor coupled to the contact pads has a capacitance higher than an equivalent capacitance in each of the photoelectric diodes.

5. The switch control unit of the optical fiber control system of claim 1, wherein when the voltage of the sensing contact pad is lower than the minimum working voltage level, the loop switching unit conducts the digital-to-analog converter to the sensing contact pad, to charge the voltage leveling capacitor in the second sensing unit; and, when the voltage of the sensing contact pad is substantially higher than the minimum working voltage level, the loop switching unit conducts the analog-to-digital converter to the sensing contact pad for sensing the voltage of the sensing contact pad.

6. The switch control unit of the optical fiber control system of claim 1, wherein the loop switching unit comprises a multiplexer, including a plurality of input terminals coupled to the contact pads, and an output terminal coupled to the analog-to-digital converter, wherein the loop switching unit is used to switch the connection between the analog-to-digital converter and the contact pads.

7. The switch control unit of the optical fiber control system of claim 1, wherein the drive unit controls optical signal generation by a light-emitting device.

8. An optical control unit of an optical fiber control system, including:
   a common contact pad;
   a digital-to-analog converter, being switchable between being coupled to a first sensing unit and being coupled to a drive unit, via the common contact pad;
   a sensing contact pad, coupled to a second sensing unit;
   wherein each of the first sensing unit and the second sensing unit has a minimum working voltage level, a photodiode and a voltage leveling capacitor;
   an analog-to-digital converter, for sensing a voltage of the photodiode at the first sensing unit, or sensing a voltage of the photodiode at the second sensing unit, to detect an output light intensity of a laser diode; and
   a loop switching unit, coupled between the common contact pad, the analog-to-digital converter, and the sensing contact pad, wherein when the voltage at the common contact pad is substantially higher than the minimum working voltage level, the loop switching unit conducts the common contact pad to the analog-to-digital converter to sense the voltage at the common contact pad.

9. The optical control unit of the optical fiber control system of claim 8, wherein the digital-to-analog converter charges the voltage leveling capacitor when the voltage at the common contact pad coupled to the first sensing unit is lower than the minimum working voltage level.

10. The optical control unit of the optical fiber control system of claim 8, wherein the loop switching unit includes a multiplexer, which includes a plurality of input terminals coupled to the contact pads, and an output terminal coupled to the analog-to-digital converter.

11. An optical control unit of an optical fiber control system having a total pin number, including:
   a common contact pad, be switchable between being coupled to a sensing unit and being coupled to a drive unit, wherein the sensing unit has a voltage leveling capacitor and a minimum working voltage level; and
   a digital-to-analog converter and an analog-to-digital converter, separately coupled to the common contact pad, wherein, when a voltage at the common contact pad is higher than the minimum working voltage level, the analog-to-digital converter senses the voltage at the common contact pad; and when the voltage at the common contact pad is lower than the minimum working voltage level, the digital-to-analog converter charges the voltage leveling capacitor of the sensing unit;
   wherein the common contact pad flexibly couples with the digital-to-analog converter or the analog-to-digital converter in a switchable way to adjust, change, increase or expand the pin number of the digital-to-analog converter or the pin number of the analog-to-digital converter, wherein the total pin number is equal to the pin number of the digital-to-analog converter plus the pin number of the analog-to-digital converter.

12. The optical control unit of the optical fiber control system of claim 11, further comprising a loop switching unit, coupled between the common contact pad and the analog-to-digital converter, wherein when the voltage at the common contact pad is substantially higher than the minimum working voltage level, the loop switching unit conducts the common contact pad to the analog-to-digital converter to sense the voltage at the common contact pad, wherein the loop switching unit includes a multiplexer, which includes a plurality of input terminals coupled to the common contact pad, and an output terminal coupled to the analog-to-digital converter.

* * * * *